United States Patent
Li et al.

(10) Patent No.: US 6,936,309 B2
(45) Date of Patent: *Aug. 30, 2005

(54) HARDNESS IMPROVEMENT OF SILICON CARBOXY FILMS

(75) Inventors: Lihua Li, San Jose, CA (US);
Tzu-Fang Huang, San Jose, CA (US);
Li-Qun Xia, Santa Clara, CA (US);
Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 263 days.

This patent is subject to a terminal disclaimer.

(21) Appl. No.: 10/115,832

(22) Filed: Apr. 2, 2002

(65) Prior Publication Data

US 2003/0186000 A1 Oct. 2, 2003

(51) Int. Cl.$^7$ .............. C08J 7/18; C08F 2/52; H05H 1/46; B05D 3/06
(52) U.S. Cl. ............ 427/535; 427/534; 427/536; 427/489; 427/579; 438/788; 438/789
(58) Field of Search .................. 427/488, 489, 427/535, 536, 534, 569, 574, 577, 578, 579, 255.27, 255.37, 255.393, 249.15, 562, 563; 438/780, 781, 787, 789, 790

(56) References Cited

U.S. PATENT DOCUMENTS

| | | | |
|---|---|---|---|
| 5,419,782 A | * 5/1995 | Levine et al. | 136/258 |
| 5,593,741 A | 1/1997 | Ikeda | 427/579 |
| 5,598,027 A | 1/1997 | Matsuura | 257/635 |
| 5,599,740 A | 2/1997 | Jang et al. | 437/190 |
| 5,616,369 A | 4/1997 | Williams et al. | 427/536 |
| 5,618,619 A | 4/1997 | Petrmichl et al. | 428/334 |
| 5,637,351 A | 6/1997 | O'Neal et al. | 427/255.3 |
| 5,638,251 A | 6/1997 | Goel et al. | 361/313 |

(Continued)

FOREIGN PATENT DOCUMENTS

| | | | |
|---|---|---|---|
| DE | 196 54 737 | 7/1997 | .......... H01L/21/31 |
| DE | 198 04 375 A1 | 7/1999 | .......... H01L/21/312 |
| DE | 199 04 311 A1 | 8/1999 | .......... C23C/16/44 |

(Continued)

OTHER PUBLICATIONS

"Low Dielectric Constant Insulator Formed by Downstream Plasma CVD at Room Temperature Using TMS/O2", A. Nara and H.Itoh, Japanese Journal of Applied Physics, vol. 36, No. 3B (Mar. 1997).

"Low Dielectric Constant Films Prepared by Plasma–Enhanced Chemical Vapor Deposition From Tetramethylsilane" A. Grill and V. Patel, Journal of Applied Physics, vol. 85, No. 6 (Mar. 1999).

V. Hazari et al., "Characterization Of Alternative Chemistries For Depositing PECVD Silicon Dioxide Films," DUMIC Conference,—333D/98/0319, pp. 319–326, Feb. 1998.

K. J. Taylor et al., "Parylene Copolymers", Spring MRS, Symposium N, pp. 1–9, 1997, no month.

"Novel Low k Dielectrics Based on Diamondlike Carbon Mterials", A. Grill, et al., J. Electrochem Soc. vol. 145 No. 5, May 1998, pp. 1649–1653.

(Continued)

Primary Examiner—Marianne Padgett
(74) Attorney, Agent, or Firm—Moser, Patterson & Sheridan

(57) ABSTRACT

A method for depositing a low dielectric constant film having an improved hardness and elastic modulus is provided. In one aspect, the method comprises depositing a low dielectric constant film having silicon, carbon, and hydrogen, and then treating the deposited film with a plasma of helium, hydrogen, or a mixture thereof at conditions sufficient to increase the hardness of the film.

22 Claims, 1 Drawing Sheet

U.S. PATENT DOCUMENTS

| | | | | |
|---|---|---|---|---|
| 5,679,413 | A | 10/1997 | Petrmichl et al. | 427/534 |
| 5,683,940 | A | 11/1997 | Yahiro | 437/195 |
| 5,693,563 | A | 12/1997 | Teong | 437/190 |
| 5,700,720 | A | 12/1997 | Hashimoto | 437/195 |
| 5,703,404 | A | 12/1997 | Matsuura | 257/758 |
| 5,739,579 | A | 4/1998 | Chiang et al. | 257/635 |
| 5,753,564 | A | 5/1998 | Fukada | 437/238 |
| 5,789,319 | A | 8/1998 | Havemann et al. | 438/668 |
| 5,800,877 | A | 9/1998 | Maeda et al. | 427/535 |
| 5,807,785 | A | 9/1998 | Ravi | 438/624 |
| 5,821,168 | A | 10/1998 | Jain | 438/692 |
| 5,834,162 | A | 11/1998 | Malba | 430/317 |
| 5,858,880 | A | 1/1999 | Dobson et al. | 438/758 |
| 5,874,367 | A | 2/1999 | Dobson | 438/787 |
| 5,888,593 | A | 3/1999 | Petrmichl et al. | 427/563 |
| 5,891,799 | A | 4/1999 | Tsui | 438/624 |
| 5,989,998 | A | 11/1999 | Sugahara et al. | 438/623 |
| 6,037,274 | A | 3/2000 | Kudo et al. | 438/778 |
| 6,051,321 | A | 4/2000 | Lee et al. | 428/447 |
| 6,054,206 | A | 4/2000 | Mountsier | 428/312.8 |
| 6,054,379 | A | 4/2000 | Yau et al. | 438/623 |
| 6,068,884 | A | 5/2000 | Rose et al. | 427/255.6 |
| 6,072,227 | A | 6/2000 | Yau et al. | 257/642 |
| 6,080,526 | A | 6/2000 | Yang et al. | 430/296 |
| 6,124,641 | A | 9/2000 | Matsuura | 257/759 |
| 6,140,226 | A | 10/2000 | Grill et al. | 438/637 |
| 6,147,009 | A | 11/2000 | Grill et al. | 438/780 |
| 6,159,871 | A | 12/2000 | Loboda et al. | 438/786 |
| 6,284,675 | B1 * | 9/2001 | Jin et al. | 438/778 |
| 6,287,990 | B1 | 9/2001 | Cheung et al. | 438/780 |
| 6,303,523 | B2 | 10/2001 | Cheung et al. | 438/780 |
| 6,312,793 | B1 | 11/2001 | Grill et al. | 428/312.6 |
| 6,316,063 | B1 | 11/2001 | Andideh et al. | 427/577 |
| 6,413,583 | B1 | 7/2002 | Moghadam et al. | 427/249.15 |
| 6,441,491 | B1 | 8/2002 | Grill et al. | |
| 6,465,372 | B1 * | 10/2002 | Xia et al. | 438/787 |
| 6,472,333 | B2 * | 10/2002 | Xia et al. | 438/758 |
| 6,479,110 | B2 | 11/2002 | Grill et al. | |
| 6,528,432 | B1 | 3/2003 | Ngo et al. | 438/780 |
| 6,531,398 | B1 * | 3/2003 | Gaillard et al. | 438/692 |
| 6,537,733 | B2 | 3/2003 | Campana et al. | |
| 6,541,398 | B2 | 4/2003 | Grill et al. | |
| 6,632,478 | B2 * | 10/2003 | Gaillard et al. | 427/255.37 |
| 6,699,784 | B2 | 3/2004 | Xia et al. | |
| 2001/0004479 | A1 | 6/2001 | Cheung et al. | 427/553 |
| 2001/0005546 | A1 | 6/2001 | Cheung et al. | 428/210 |
| 2001/0021590 | A1 | 9/2001 | Matsuki | 438/780 |
| 2001/0055672 | A1 | 12/2001 | Todd | 428/212 |
| 2002/0016085 | A1 | 2/2002 | Huang et al. | |
| 2002/0068458 | A1 | 6/2002 | Chiang et al. | 438/694 |
| 2002/0098714 | A1 | 7/2002 | Grill et al. | 438/778 |
| 2002/0106500 | A1 * | 8/2002 | Albano et al. | 427/488 |
| 2002/0155386 | A1 | 10/2002 | Xu et al. | |
| 2003/0006407 | A1 * | 1/2003 | Leu et al. | 438/780 |
| 2003/0054115 | A1 * | 3/2003 | Albano et al. | 427/487 |
| 2003/0129827 | A1 | 7/2003 | Lee et al. | |
| 2003/0139035 | A1 | 7/2003 | Yim et al. | |
| 2003/0148020 | A1 | 8/2003 | Campana et al. | |
| 2003/0148223 | A1 | 8/2003 | Campana et al. | |
| 2003/0194495 | A1 | 10/2003 | Li et al. | |
| 2004/0132281 | A1 | 7/2004 | Ingerty et al. | |
| 2004/0166240 | A1 | 8/2004 | Rhee et al. | |
| 2005/0014391 | A1 * | 1/2005 | Shioya et al. | 438/789 |

FOREIGN PATENT DOCUMENTS

| | | | | |
|---|---|---|---|---|
| EP | 0 771 886 A1 | 5/1997 | | C23C/16/36 |
| EP | 0 774 533 A1 | 5/1997 | | C23C/16/40 |
| EP | 0 840 365 | 5/1998 | | H01L/21/311 |
| EP | 0 849 789 | 6/1998 | | H01L/21/768 |
| EP | 0 885 983 A1 | 12/1998 | | C23C/16/30 |
| EP | 0 926 715 A2 | 6/1999 | | H01L/21/3105 |
| EP | 0 926 724 A2 | 6/1999 | | H01L/21/76 |
| EP | 0 935 283 A2 | 8/1999 | | H01L/21/312 |
| EP | 1 037 275 | 9/2000 | | H01L/21/768 |
| EP | 1 123 991 A2 | 8/2001 | | C23C/16/40 |
| EP | 1 176 226 A1 | 1/2002 | | |
| GB | 2 316 535 A | 2/1998 | | H01L/21/31 |
| JP | 9-8031 | 1/1997 | | H01L/21/316 |
| JP | 9-64029 | 3/1997 | | H01L/21/316 |
| JP | 9-237785 | 9/1997 | | H01L/21/316 |
| JP | 9-251997 | 9/1997 | | H01L/21/316 |
| JP | 9-260369 | 10/1997 | | H01L/21/316 |
| JP | 10-242143 | 9/1998 | | H01L/21/316 |
| JP | 11-251293 A | 9/1999 | | H01L/21/3065 |
| WO | 98/08249 | 2/1998 | | H01L/21/312 |
| WO | 98/59089 | 12/1998 | | C23C/16/30 |
| WO | 99/38202 | 7/1999 | | H01L/21/312 |
| WO | 99/41423 | 8/1999 | | C23C/16/40 |
| WO | 99/55526 | 11/1999 | | B32B/9/04 |
| WO | 00/01012 | 1/2000 | | H01L/23/48 |
| WO | WO 00/19468 A1 | 4/2000 | | |
| WO | 01/01472 | 1/2001 | | H01L/21/312 |
| WO | 02/43119 | 5/2002 | | |
| WO | WO 03/005429 A1 | 1/2003 | | |

OTHER PUBLICATIONS

"Deposition of Low k Dielectric Films Using Trimethylsilane", M. J. Loboda, et al., Electrochem Soc. Proceedigns, vol. 98–6, pp. 152, 1999, no month.

"Low Dielectric Constant Oxide Films Deposited Using CVD Techniques," S. McClatchie, et al., Feb. 16–17, 1998, DUMIC Conf., pp. 311–318, Feb.

"Using Trimethylsilane to Imrpove Safety, Throughput and Versatility in PECVD Processes," M. J. Loboda, et al., Electrochemical Proceedings vol. 97–10, pp. 443–453, no date given.

"Safe Precursor Gas For Broad Replacement of $Sih_4$ In Plasma Processes Employed In Integrated Circuit Production," M. J. Loboda, et al., Materials Research Soc. vol. 447, pp. 145–151, Dec. 1996.

"Plasma Polymerization of Trimethylsilane in Cascade Arc Discharge," Y.S. Lin, et al., J. Applied Polymer Science, vol. 66, 1653–1665 (1997), no month, but after Feb.

"A Comparative Study of Sub–Micron Gap Filling And PlanarizationTechniques," A. Haas Bar–Ilan, et al., SPIE vol. 2636, pp. 277–288, no date.

"Reactivity of Alkylsilanes and Alkylcarbosilanes in Atomic Hydrogen–Induced Chemical Vapor Deposition," A. M. Wrobel, et al., J. Electrochem. Soc., vol. 145, No. 3, Mar. 1998, pp. 1060–1065.

"Diamondlike Carbon Materials As BEOL Interconnect Dielectrics: Integration Issues," A. Grill, et al., Electrochemical Soc. Proceedings vol. 98–3, pp. 118–129, no date.

Grill, et al. "Diamondlike Carbon Materials as Low–k Dielectrics" Conference Proceedings ULSI XII Materials Research Society, 1997, p. 417–422, no month.

European Search Report for EP 00 11 2300, Dated Aug. 24, 2001.

Peter, "Pursuing the Perfect Low–K Dielectric," Semiconductor International, Sep., 1998.

Zhao, et al., "Integration of Low Dielectric Constant Materials in Advanced Aluminum and Copper Interconnects," Mat. Res. Soc. Symp. Proc. vol. 564, 1999, p. 485–497, no month.

Robles, et al., "Characterization of High Density Plasma Chemical Vapor Deposit alpa–Carbon and alpha–Fluorinated Carbon Films for Ultra Low Dielectric Applications," DUMIC Conference, Feb. 1997, p. 26–33.

Sugahara, et al., "Low Dielectric Constant Carbon Containing SiO2 Films Deposited by PECVD Technique Using a Novel CVD Precursor," DUMIC Conference, Feb. 1997, p 19–25.

PCT International Search Report and Written Opinion for PCT/US2004/018701, dated Feb. 24, 2005 (AMAT/8435.PC).

* cited by examiner

HARDNESS IMPROVEMENT OF SILICON CARBOXY FILMS

BACKGROUND OF THE DISCLOSURE

1. Field of the Invention

Embodiments of the present invention relate to the fabrication of integrated circuits. More particularly, embodiments of the present invention relate to a process for depositing dielectric layers on a substrate.

2. Background of the Invention

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 μm and even 0.1 μm feature sizes, and tomorrow's facilities soon will be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable. Examples of insulators having low dielectric constants include spin-on glass, such as un-doped silicon glass (USG) or fluorine-doped silicon glass (FSG), silicon dioxide, and polytetrafluoroethylene (PTFE), which are all commercially available.

More recently, organosilicon films having k values less than about 3.5 have been developed. In an attempt to further lower k values, Rose et al. (U.S. Pat. No. 6,068,884) disclosed a method for depositing an insulator by partially fragmenting a cyclic organosilicon compound to form both cyclic and linear structures in the deposited film. However, this method of partially fragmenting cyclic precursors is difficult to control and thus, product consistency is difficult to achieve.

There is a need, therefore, for a controllable process for making lower dielectric constant materials to improve the speed and efficiency of devices on integrated circuits.

SUMMARY OF THE INVENTION

A method for depositing a low dielectric constant film having an improved hardness and elastic modulus is provided. In one aspect, the method comprises depositing a low dielectric constant film having silicon, carbon, and hydrogen, and then treating the deposited film with a plasma of helium, hydrogen, or a mixture thereof at conditions sufficient to increase the hardness of the film.

In another aspect, a method for depositing a low dielectric constant film having an improved hardness and elastic modulus is provided by reacting a mixture of about 5 percent by volume to about 80 percent by volume of one or more cyclic organosilicon compounds, about 5 percent by volume to about 15 percent by volume of one or more aliphatic compounds, and about 5 percent by volume to about 20 percent by volume of one or more oxidizing gases. The gas mixture is deposited on a surface of the substrate and then treated in situ with a plasma of helium, hydrogen, or a mixture thereof at conditions sufficient to increase the hardness of the film.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the description and appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
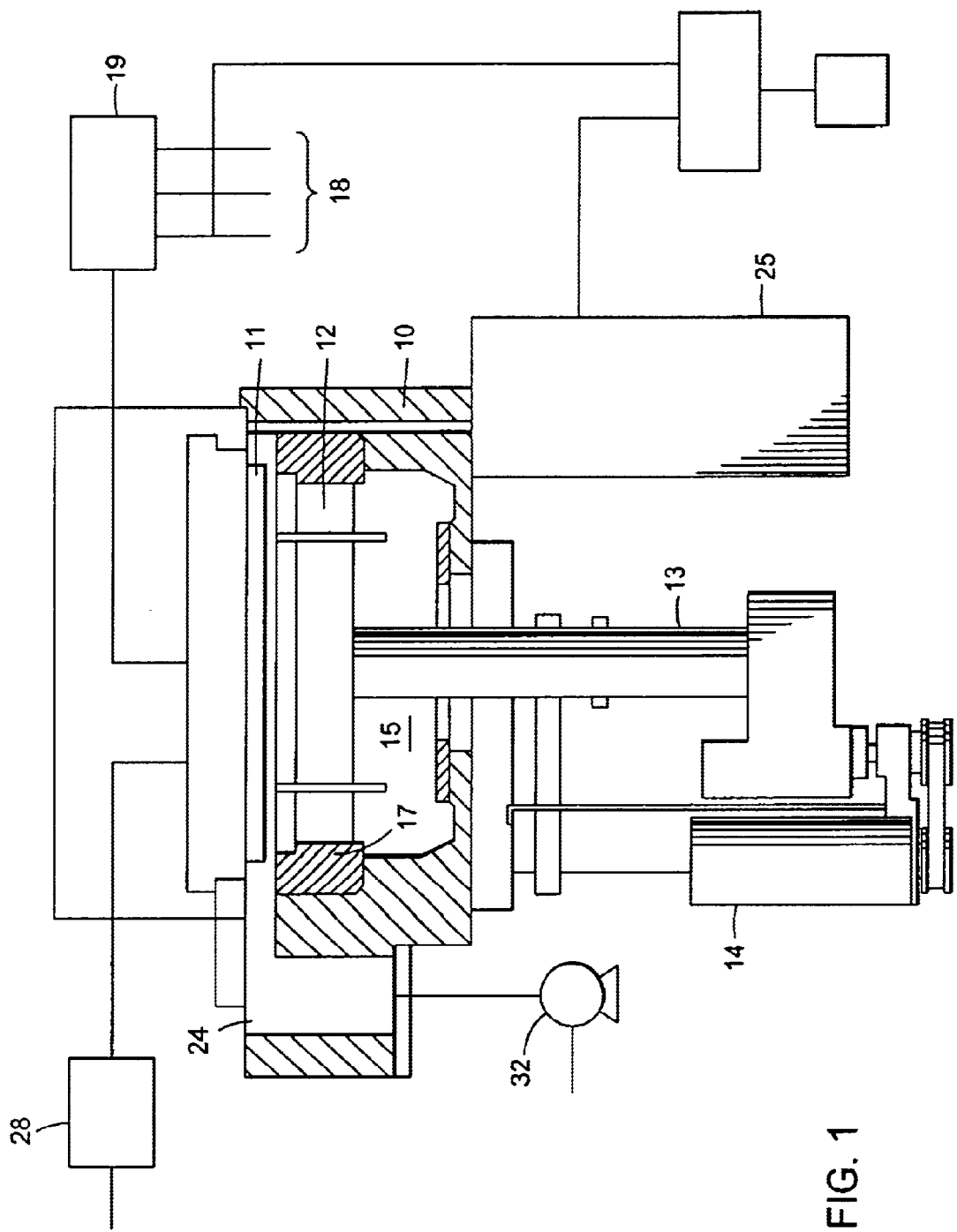
FIG. 1 is a cross-sectional diagram of an exemplary CVD reactor configured for use according to embodiments described herein.

The present invention provides a significant and unexpected increase in hardness of an ultra low dielectric constant film. In one aspect, a film containing silicon, oxygen, and carbon is deposited on a surface of a substrate at conditions sufficient to form an ultra low dielectric constant film (k less than 2.5). The ultra low dielectric constant film is then subjected to an in situ post treatment of helium, hydrogen, or a mixture thereof. The post treatment increases the surface energy of the substrate thereby improving the wetting properties of the deposited film. The post treatment also gives the film an improved hardness and elastic modulus that makes the film more durable and stable.

In one aspect, one or more precursor gases are blended/mixed to form the ultra low dielectric constant film. The one or more precursor gases may include cyclic organosilicon compounds, aliphatic compounds, hydrocarbon compounds, and oxidizing compounds. The cyclic organosilicon compounds may include a ring structure having three or more silicon atoms and the ring structure may further comprise one or more oxygen atoms. Commercially available cyclic organosilicon compounds include rings having alternating silicon and oxygen atoms with one or two alkyl groups bonded to the silicon atoms. For example, the cyclic organosilicon compounds may include one or more of the following compounds:

| | | |
|---|---|---|
| 1,3,5-trisilano-2,4,6-trimethylene, | —($SiH_2CH_2$—)$_3$— | (cyclic) |
| 1,3,5,7-tetramethylcyclotetrasiloxane (TMCTS) | —($SiHCH_3$—O—)$_4$— | (cyclic) |
| octamethylcyclotetrasiloxane (OMCTS), | —($Si(CH_3)_2$—O—)$_4$— | (cyclic) |
| 1,3,5,7,9-pentamethylcyclopentasiloxane, | —($SiHCH_3$—O—)$_5$— | (cyclic) |
| 1,3,5,7-tetrasilano-2,6-dioxy-4,8-dimethylene, | —($SiH_2$—$CH_2$—$SiH_2$—O—)$_2$— | (cyclic) |
| hexamethylcyclotrisiloxane | —($Si(CH_3)_2$—O—)$_3$— | (cyclic) | of helium, hydrogen, or a mixture thereof at conditions sufficient to increase the hardness of the film.

In another aspect, a method for depositing a low dielectric constant film having an improved hardness and elastic modulus is provided by reacting a mixture of about 5 percent The aliphatic compounds include linear or branched (i.e. acyclic) organosilicon compounds having one or more silicon atoms and one or more carbon atoms and linear or branched hydrocarbon compounds having at least one unsaturated carbon bond. The structures may further comprise oxygen. Commercially available aliphatic organosilicon compounds include organosilanes that do not contain oxygen between silicon atoms and organosiloxanes that contain oxygen between two or more silicon atoms. For example, the aliphatic organosilicon compounds may include one or more of the following compounds:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| dimethyldimethoxysilane, | $(CH_3)_2$—$Si$—$(OCH_3)_2$ |
| ethylsilane, | $CH_3$—$CH_2$—$SiH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3-dimethyldisiloxane, | $CH_3$—$SiH_2$—$O$—$SiH_2CH_3$ |
| 1,1,3,3-tetramethyldisiloxane (TMDSO), | $(CH_3)_2$—$SiH$—$O$—$SiH$—$(CH_3)_2$ |
| hexamethyldisiloxane (HMDS), | $(CH_3)_3$—$Si$—$O$—$Si$—$(CH_3)_3$ |
| 1,3-bis(silanomethylene)disiloxane, | $(SiH_3$—$CH_2$—$SiH_2)_2$—$O$ |
| bis(1-methyldisiloxanyl)methane, | $(CH_3$—$SiH_2$—$O$—$SiH_2)_2CH_2$ |
| 2,2-bis(1-methyldisiloxanyl)propane, | $(CH_3$—$SiH_2$—$O$—$SiH_2)_2C(CH_3)_2$ |
| hexamethoxydisiloxane (HMDOS) | $(CH_3O)_3$—$Si$—$O$—$Si$—$(OCH_3)_3$ |
| diethylsilane | $((C_2H_5)_2SiH_2)$, |
| propylsilane | $(C_3H_7SiH_3)$, |
| vinylmethylsilane | $(CH_2$=$CH)CH_3SiH_2)$, |
| 1,1,2,2-tetramethyldisilane | $(HSi(CH_3)_2$—$Si(CH_3)_2H)$, |
| hexamethyldisilane | $((CH_3)_3Si$—$Si(CH_3)_3)$, |
| 1,1,2,2,3,3-hexamethyltrisilane | $(H(CH_3)_2Si$—$Si(CH_3)_2$—$SiH(CH_3)_2)$, |
| 1,1,2,3,3-pentamethyltrisilane | $(H(CH_3)_2Si$—$SiH(CH_3)$—$SiH(CH_3)_2)$, |
| dimethyldisilanoethane | $(CH_3$—$SiH_2$—$(CH_2)_2$—$SiH_2$—$CH_3)$, |
| dimethyldisilanopropane | $(CH_3$—$SiH$—$(CH_2)_3$—$SiH$—$CH_3)$, |
| tetramethyldisilanoethane | $((CH_3)_2$—$SiH$—$(CH_2)_2$—$SiH$—$(CH_3)_2)$, |
| tetramethyldisilanopropane | $((CH_3)_2$—$Si$—$(CH_2)_3$—$Si$—$(CH_3)_2)$, |

The hydrocarbon compounds have between one and about 20 adjacent carbon atoms. The hydrocarbon compounds can include adjacent carbon atoms that are bonded by any combination of single, double, and triple bonds. For example, the organic compounds may include alkenes and alkylenes having two to about 20 carbon atoms, such as ethylene, propylene, acetylene, and butadiene.

The one or more oxidizing gases may include oxygen ($O_2$), ozone ($O_3$), nitrous oxide ($N_2O$), carbon monoxide (CO), carbon dioxide ($CO_2$), water ($H_2O$), peroxide ($H_2O_2$) or combinations thereof. In one aspect, the oxidizing gas is oxygen gas. In another aspect, the oxidizing gas is ozone. When ozone is used as an oxidizing gas, an ozone generator converts from 6% to 20%, typically about 15%, by weight of the oxygen in a source gas to ozone, with the remainder typically being oxygen. Yet, the ozone concentration may be increased or decreased based upon the amount of ozone desired and the type of ozone generating equipment used. The one or more oxidizing gases are added to the reactive gas mixture to increase reactivity and achieve the desired carbon content in the deposited film.

The deposited film contains a carbon content between about 5 and about 30 atomic percent (excluding hydrogen atoms), preferably between about 5 and about 20 atomic percent. The carbon content of the deposited films refers to atomic analysis of the film structure that typically does not contain significant amounts of non-bonded hydrocarbons. The carbon contents are represented by the percent of carbon atoms in the deposited film, excluding hydrogen atoms that are difficult to quantify. For example, a film having an average of one silicon atom, one oxygen atom, one carbon atom, and two hydrogen atoms has a carbon content of 20 atomic percent (one carbon atom per five total atoms), or a carbon content of 33 atomic percent excluding hydrogen atoms (one carbon atom per three total atoms).

FIG. 1 shows a vertical, cross-section view of a parallel plate chemical vapor deposition (CVD) processing chamber 10 having a high vacuum region 15. The processing chamber 10 contains a gas distribution manifold 11 having perforated holes for dispersing process gases there-through to a substrate (not shown). The substrate rests on a substrate support plate or susceptor 12. The susceptor 12 is mounted on a support stem 13 that connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. An insulator 17 surrounds the susceptor 12 and the substrate when in an upper processing position.

Gases introduced to the manifold 11 are uniformly distributed radially across the surface of the substrate. A vacuum pump 32 having a throttle valve controls the exhaust rate of gases from the chamber 10 through a manifold 24. Deposition and carrier gases flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

In one aspect, a blend/mixture of one or more cyclic organosilicon compounds and one or more aliphatic compounds are reacted with an oxidizing gas to form an ultra low k film on the substrate. Preferably, the cyclic organosilicon compounds are combined with at least one aliphatic organosilicon compound and at least one aliphatic hydrocarbon compound. For example, the mixture contains about 5 percent by volume to about 80 percent by volume of the one or more cyclic organosilicon compounds, about 5 percent by volume to about 15 percent by volume of the one or more aliphatic organosilicon compounds, and about 5 percent by volume to about 45 percent by volume of the one or more aliphatic hydrocarbon compounds. The mixture also contains about 5 percent by volume to about 20 percent by volume of the one or more oxidizing gases. More preferably, the mixture contains about 45 percent by volume to about 60 percent by volume of one or more cyclic organosilicon compounds, about 5 percent by volume to about 10 percent by volume of one or more aliphatic organosilicon compounds, and about 5 percent by volume to about 35 percent by volume of one or more aliphatic hydrocarbon compounds.

The one or more cyclic organosilicon compounds are typically introduced to the mixing system 19 at a flowrate of about 100 to about 10,000 sccm, preferably about 520 sccm. The one or more aliphatic organosilicon compounds are introduced to the mixing system 19 at a flowrate of about 100 sccm to about 10,000 sccm, preferably about 600 sccm. The one or more aliphatic hydrocarbon compounds are introduced to the mixing system 19 at a flowrate of about 100 to about 10,000 sccm, preferably 2,000 sccm. The oxygen containing gas has a flowrate between about 100 and about 10,000 sccm. Preferably, the cyclic organosilicon compound is 2,4,6,8-tetramethylcyclotetrasiloxane, octamethylcyclotetrasiloxane, or a mixture thereof, and the aliphatic organosilicon compound is trimethylsilane, 1,1,3,3-tetramethyldisiloxane, or a mixture thereof. The aliphatic hydrocarbon compound is preferably ethylene.

The deposition process can be either a thermal process or a plasma enhanced process. In a plasma enhanced process, a controlled plasma is typically formed adjacent the substrate by RF energy applied to the gas distribution manifold 11 using a RF power supply 25. Alternatively, RF power can be provided to the susceptor 12. The RF power to the deposition chamber may be cycled or pulsed to reduce heating of the substrate and promote greater porosity in the deposited film. The power density of the plasma for a 200 mm substrate is between about 0.03 W/cm$^2$ and about 3.2 W/cm$^2$, which corresponds to a RF power level of about 10 W to about 2000 W. Preferably, the RF power level is between about 300 W and about 1700 W.

The RF power supply 25 can supply a single frequency RF power between about 0.01 MHz and 300 MHz. Alternatively, the RF power may be delivered using mixed, simultaneous frequencies to enhance the decomposition of reactive species introduced into the high vacuum region 15. In one aspect, the mixed frequency is a lower frequency of about 12 kHz and a higher frequency of about 13.56 MHz. In another aspect, the lower frequency may range between about 300 Hz to about 1,000 kHz, and the higher frequency may range between about 5 MHz and about 50 MHz.

During deposition, the substrate is maintained at a temperature between about −20° C. and about 500° C., preferably between about 100° C. and about 450° C. The deposition pressure is typically between about 1 Torr and about 20 Torr, preferably between about 4 Torr and about 7 Torr. The deposition rate is typically between about 10,000 A/min and about 20,000 A/min.

When additional dissociation of the oxidizing gas is desired, an optional microwave chamber 28 can be used to input power between about 50 Watts and about 6,000 Watts to the oxidizing gas prior to the gas entering the processing chamber 10. The additional microwave power can avoid excessive dissociation of the organosilicon compounds prior to reaction with the oxidizing gas. A gas distribution plate (not shown) having separate passages for the organosilicon compound and the oxidizing gas is preferred when microwave power is added to the oxidizing gas.

Typically, any or all of the chamber lining, distribution manifold 11, susceptor 12, and various other reactor hardware are made out of materials such as aluminum or anodized aluminum. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," which is incorporated by reference herein.

Once the film is deposited, the deposition chamber is evacuated using the vacuum pump 32 to remove any residual process gases. Optionally, an inert gas such as argon, helium, nitrogen, or a mixture thereof is flowed into the chamber to expedite the evacuation step. Then, an in-situ post treatment is performed whereby the film is subjected to a temperature between about 100° C. and about 400° C. for about 2 seconds to about 10 minutes, preferably about 30 seconds. Helium, hydrogen, or a mixture thereof is flowed into the chamber at a rate of about 200 to about 10,000 sccm. The chamber pressure is maintained between about 2 Torr and about 10 Torr. The RF power is about 200 W to about 800 W at a frequency of about 13.56 MHz, and the preferable substrate spacing is between about 300 mils and about 800 mils. Preferably, the film is treated in one cycle using hydrogen gas.

The processing steps of the embodiments described herein may be performed in an integrated processing platform such as the Producer™ processing system available from Applied Materials, Inc. of Santa Clara, Calif. To facilitate the control and automation of the overall system, the integrated processing system may include a controller comprising a central processing unit (CPU), memory, and support circuits. The CPU may be one of any form of computer processors that are used in industrial settings for controlling various drives and pressures. The memory is connected to the CPU, and may be one or more of a readily available memory such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

EXAMPLES

The following examples illustrate the low dielectric films with an improved hardness. The films were deposited using a chemical vapor deposition chamber. In particular, the films were deposited using a "Producer" system, available from Applied Materials, Inc. of Santa Clara, Calif.

Example 1

A low dielectric constant film was deposited on a 200 mm substrate from the following reactive gases at a chamber pressure of about 5.75 Torr and substrate temperature of about 400° C.

Octamethylcyclotetrasiloxane (OMCTS), at about 520 sccm;

Trimethylsilane (TMS), at about 600 sccm;

Ethylene, at about 2,000 sccm;

Oxygen, at about 1,000 sccm; and

Helium, at about 1,000 sccm.

The substrate was positioned 1,050 mils from the gas distribution showerhead. A power level of about 800 W at a frequency of 13.56 MHz was applied to the showerhead for plasma enhanced deposition of the film. The film was deposited at a rate of about 12,000 A/min, and had a dielectric constant (k) of about 2.54 measured at 0.1 MHz.

The film was then treated using a plasma of hydrogen gas. During the post treatment, the chamber pressure was about 5 Torr at a temperature of about 400° C. The substrate was positioned 500 mils from the gas distribution showerhead. A power level of about 300 W at a frequency of 13.56 MHz was applied to the showerhead. Hydrogen was flowed into the chamber at a rate of about 500 sccm for about 30 seconds. The film had a hardness of about 0.81 gPa.

Example 2

A low dielectric constant film was deposited on a 200 mm substrate from the following reactive gases at a chamber pressure of about 6 Torr and substrate temperature of about 400° C.

Octamethylcyclotetrasiloxane (OMCTS), at about 520 sccm;

Trimethylsilane (TMS), at about 600 sccm;

Ethylene, at about 2,000 sccm;

Oxygen, at about 1,000 sccm; and

Helium, at about 1,000 sccm.

The substrate was positioned 1,050 mils from the gas distribution showerhead. A power level of about 800 W at a frequency of 13.56 MHz was applied to the showerhead for plasma enhanced deposition of the film. The film was deposited at a rate of about 12,000 A/min, and had a dielectric constant (k) of about 2.5 measured at 0.1 MHz and the film had a hardness of about 0.53 gPa.

It was surprisingly found that the post treatment (Example 1) significantly increased the hardness of the film. As shown above, the post treatment produced a film having more than a 52% increase in hardness (Example 1) compared to a film not subjected to the post treatment (Example 2).

While the foregoing is directed to preferred embodiments of the present invention, other and further embodiments of the invention may be devised without departing from the basic scope thereof, and the scope thereof is determined by the claims which follow.

What is claimed is:

1. A method for depositing a low dielectric constant film having a dielectric constant less than 4.0 or about 4.0 and having an improved hardness, comprising:
   depositing a low dielectric constant film having a dielectric constant less than 4.0 or about 4.0 and comprising silicon, carbon, and oxygen, wherein depositing the low dielectric constant film comprises reacting a mixture comprising an organosilicon compound in the presence of a plasma formed by RF power; and then
   treating the deposited film with a plasma of a mixture of helium and hydrogen at conditions sufficient to increase the hardness of the film.

2. The method of claim 1, wherein the organosilicon compound is an aliphatic organosilicon compound.

3. The method of claim 2, wherein the mixture further comprises a cyclic organosilicon compound comprising at least one silicon-carbon bond.

4. The method of claim 2, wherein the aliphatic organosilicon compound comprises a silicon-hydrogen bond.

5. The method of claim 2, wherein the mixture further comprises an aliphatic hydrocarbon compound comprising an unsaturated carbon-carbon bond.

6. The method of claim 3, wherein the cyclic organosilicon compound is selected from the group consisting of 3,5-trisilano-2,4,6-trimethylene, 1,3,5,7-tetramethylcyclotetrasiloxane (TMCTS), octamethylcyclotetrasiloxane (OMCTS), 1,3,5,7,9,-pentamethylcyclopentasiloxane, 1,3,5,7-tetrasilano-2,6-dioxy-4,8-dimethylene, and hexamethylcyclotrisiloxane.

7. The method of claim 2, wherein the aliphatic organosilicon compound is selected from the group consisting of methylsilane, dimethylsilane, trimethylsilane, dimethyldimethoxysilane, ethylsilane, disilanomethane, bis(methylsilano)methane, 1,2-disilanoethane, 2,2-bis(methylsilano)ethane, 1,2-disilanopropane, 1,3-dimethyldisiloxane, 1,1,3,3-tetramethyldisiloxane (TMDSO), hexamethyldisiloxane (HMDS), 1,3-bis(silanomethylene)disiloxane, bis(1-methyldisiloxanyl)methane, 2,2-bis(1-methyldisiloxanyl)propane, diethylsilane, propylsilane, vinylmethylsilane, 1,1,2,2-tetramethyldisilane, hexamethyldisilane, 1,1,2,2,3,3-hexamethyltrisilane, 1,1,2,3,3-pentamethyltrisilane, dimethyldisilanoethane, dimethyldisilanopropane, tetramethyldisilanoethane, and tetramethyldisilanopropane.

8. The method of claim 3, wherein the cyclic organosilicon compound is 3,5-trisilano-2,4,6-trimethylene, 1,3,5,7-tetramethylcyclotetrasiloxane (TMCTS), octamethylcyclotetrasiloxane (OMCTS), or a mixture thereof.

9. The method of claim 5, wherein the aliphatic organosilicon compound is trimethylsilane, and the aliphatic hydrocarbon compound is ethylene.

10. The method of claim 1, wherein the RF power comprises a power density ranging from about 0.03 W/cm$^2$ to about 3.2 W/cm$^2$ at a frequency of about 13.56 MHz.

11. The method of claim 1, wherein the conditions comprise a substrate temperature of about 100° C. to about 400° C.

12. The method of claim 1, wherein the conditions comprise a pressure of about 4 Torr to about 10 Torr.

13. A method for depositing a low dielectric constant film having a dielectric constant less than 4.0 or about 4.0 and having an improved hardness, comprising:
   reacting a gas mixture comprising:
      one or more cyclic organosilicon compounds;
      one or more aliphatic compounds; and
      one or more oxidizing gases in the presence of a plasma formed by RF power;
   depositing the low dielectric constant film having a dielectric constant less than 4.0 or about 4.0 on a surface of the substrate; and
   treating the deposited film with a plasma of helium, hydrogen, or a mixture thereof at conditions sufficient to increase the hardness of the film.

14. The method of claim 13, wherein treating the deposited film comprises flowing hydrogen gas at a rate of about 200 to about 10,000 sccm across a surface of the film for about 30 seconds.

15. The method of claim 13, wherein the one or more aliphatic compounds comprises ethylene, methylsilane, dimethylsilane, trimethylsilane, or a mixture thereof.

16. A method for depositing a low dielectric constant film having a dielectric constant less than 4.0 or about 4.0 and having an improved hardness, comprising:
   reacting a gas mixture comprising:
      about 5 percent by volume to about 80 percent by volume of one or more cyclic organosilicon compounds;

about 5 percent by volume to about 15 percent by volume of one or more aliphatic compounds; and about 5 percent by volume to about 20 percent by volume of one or more oxidizing gases in the presence of a plasma formed by RF power;

depositing the low dielectric constant film having a dielectric constant less than 4.0 or about 4.0 on a surface of the substrate; and treating the deposited film with a plasma of helium, hydrogen, or a mixture thereof at conditions sufficient to increase the hardness of the film.

17. The method of claim 16, wherein treating the deposited film comprises flowing hydrogen gas at a rate of about 500 sccm across a surface of the film for about 30 seconds.

18. The method of claim 16, wherein the one or more aliphatic compounds comprises ethylene, methylsilane, dimethylsilane, trimethylsilane, or a mixture thereof.

19. A method for depositing a dielectric film, comprising:

depositing a dielectric film having a dielectric constant less than 4.0 or about 4.0 and comprising silicon, carbon, and oxygen, wherein depositing the dielectric film comprises reacting a mixture comprising one or more cyclic organosilicon compounds, one or more aliphatic hydrocarbon compounds, and one or more oxidizing gases in the presence of a plasma formed by RF power; and then treating the deposited film with a plasma of helium, hydrogen, or a mixture thereof at conditions sufficient to increase the hardness of the film.

20. The method of claim 19, wherein the one or more aliphatic hydrocarbon compounds is selected from the group consisting of ethylene, propylene, acetylene, butadiene, t-butylethylene, and 1,1,3,3-tetramethylbutylbenzene.

21. The method of claim 19, wherein the mixture further comprises one or more aliphatic organosilicon compounds.

22. The method of claim 21, wherein the one or more cyclic organosilicon compounds is octamethylcyclotetrasiloxane, the one or more aliphatic hydrocarbon compounds is ethylene, the one or more aliphatic organosilicon compounds is trimethylsilane, and the one or more oxidizing gases is oxygen.

* * * * *

UNITED STATES PATENT AND TRADEMARK OFFICE
CERTIFICATE OF CORRECTION

PATENT NO. : 6,936,309 B1　　　　　　　　　　　　　　　　　　　　　Page 1 of 1
APPLICATION NO. : 10/115832
DATED : August 30, 2005
INVENTOR(S) : Lihua Li et al.

It is certified that error appears in the above-identified patent and that said Letters Patent is hereby corrected as shown below:

Column 3, Line 14: Change "1,2-disiianoethane" to --1,2-disilanoethane--

Column 3, Line 17: Change "1,3-dimethyidisiloxane" to --1,3-dimethyldisiloxane--

Column 3, Line 34: Replace the comma with a period

<u>In the Claims</u>

Column 8, Claim 7, Lines 14-15: Change "2,2-bis(methylsilano)ethane" to --1,2-bis(methylsilano)ethane--

Column 8, Claim 7, Line 15: Change "1,2-disilanopropane" to --2,2-disilanopropane--

Signed and Sealed this

Fifteenth Day of August, 2006

JON W. DUDAS
*Director of the United States Patent and Trademark Office*